United States Patent [19]
Park et al.

[11] Patent Number: 5,627,796
[45] Date of Patent: May 6, 1997

[54] PULSE GENERATION CIRCUIT AND MEMORY CIRCUIT INCLUDING SAME

[75] Inventors: Jong H. Park, Kyungki-do; Weon H. Jeong, Seoul, both of Rep. of Korea

[73] Assignee: LG Semicon Co., Ltd., Choongchungbook-do, Rep. of Korea

[21] Appl. No.: 600,159

[22] Filed: Feb. 12, 1996

[30] Foreign Application Priority Data

Feb. 16, 1995 [KR] Rep. of Korea .................... 2901/1995

[51] Int. Cl.⁶ .................................................. G11C 8/00
[52] U.S. Cl. .................................. 365/233.5; 365/189.08; 365/194
[58] Field of Search ............................. 365/233.5, 194, 365/189.08

[56] References Cited

U.S. PATENT DOCUMENTS

| | | | |
|---|---|---|---|
| 4,947,379 | 8/1990 | Okuyama | 365/233.5 |
| 5,258,952 | 11/1993 | Coker et al. | 365/194 |
| 5,371,716 | 12/1994 | Yamanaka | 365/233.5 |
| 5,434,824 | 7/1995 | Matsuzaki | 365/233.5 |
| 5,438,548 | 8/1995 | Houston | 365/233.5 |

*Primary Examiner*—Son T. Dinh
*Attorney, Agent, or Firm*—Morgan, Lewis and Bockius LLP

[57] ABSTRACT

A pulse generation circuit of a memory comprises a first logic operation unit for performing a logical operation on an address transition detection pulse and a delayed address transition detection pulse to produce first and second pulses, a switching unit controlled by an externally applied write enable signal for selecting one of the first and second pulses as an output pulse and for inverting the write enable signal, and a second logic operation unit for performing a logical operation on the output pulse and the inverted write enable signal from the switching unit to generate a word line enable signal and a sense amplifying enable signal.

10 Claims, 3 Drawing Sheets

FIG. 3
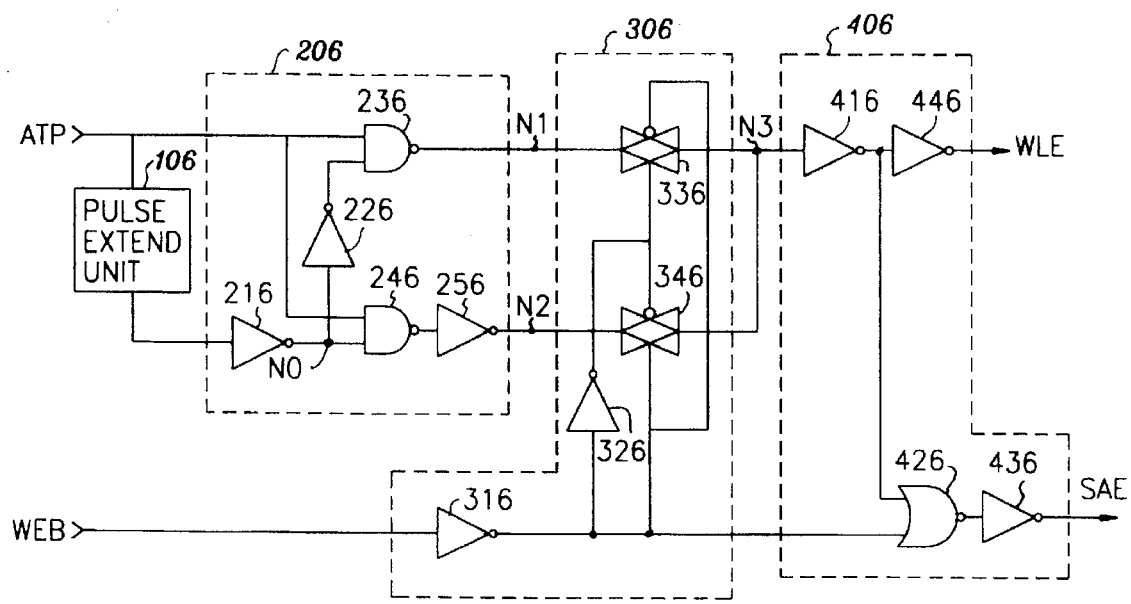
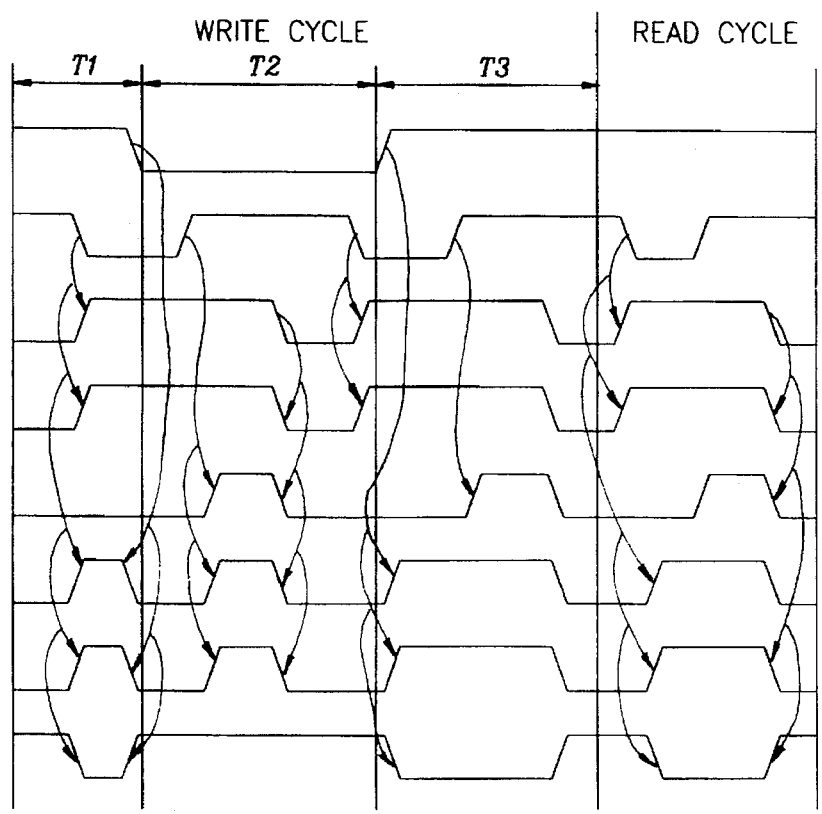

PULSE GENERATION CIRCUIT AND MEMORY CIRCUIT INCLUDING SAME

BACKGROUND OF THE INVENTION

1. Field of the Invention

The present invention relates to a pulse generation circuit, and particularly, to a pulse generation circuit of a memory.

2. Description of the Related Art

As shown in FIG. 1, a conventional static RAM circuit includes a read/write control unit 1 provided for outputting first and second control signals CS and WE so as to control a read/write operation in a static RAM circuit in accordance with a chip selection signal CSB, a write enable signal WEB and an output enable signal OEB, an address input unit 2 provided for outputting signals ADS0 and ADS1 each corresponding to first and second address signals AD0 and AD1, respectively, which are applied from an externally connected element by a first control signal CS outputted from the read/write control unit 1, a data input unit 3 provided for outputting data corresponding to data DATA IN outputted from an externally connected element in accordance with a second control signal outputted from the read/write control unit 1, an address decoding unit 4 provided for decoding signals ADS0 and ADS1 outputted from the address input unit 2, an address transition detector 5 provided for detecting the transition of the signals ADS0 and ADS1 outputted from the address input unit 2 and for outputting an address transition detection pulse ATP, a pulse generator 6 provided for outputting a word line enable signal WLE and a sense amplifying enable signal SAE in accordance with an address transition detection signal ATF outputted from the address transition detectors, a logic operator 7 provided for logically operating a signal outputted from the address decoding unit 4 and a word line enable signal WLE outputted from the pulse generator 6, a data transfer unit 9 provided for transferring the data stored in a memory cell 8 to bit lines BL and BLB and for transferring the data outputted from the data input unit 3 to the memory cell 8 through the bit lines BL and BLB after it is enabled by a sense amplifying enable signal SAE outputted from the pulse generator 6, a sense amplifier 10 provided for amplifying the data outputted from the data transfer unit 9 after it is enabled by a sense amplifying enable signal SAE outputted from the pulse generator 6, and an output buffer 11 provided for buffering the data SAO and SAOB outputted from the sense amplifier 10 and for outputting the buffered data DATA OUT.

The address decoding unit 4 includes inverters I1 and I2 provided for inverting the signals ADS0 and ADS1 outputted from the address input unit 2, an AND gate A1 provided for logically ANDing the signals outputted from the inverters I1 and I2, an AND gate A2 provided for ANDing the signal outputted from the inverter I1 and the signal ADS1 outputted from the address input unit 2, an AND gate A3 provided for ANDing the signal ADS0 outputted from the address input unit 2 and the signal outputted from the inverter I2, and an AND gate A4 provided for ANDing the signals ADS0 and ADS1 outputted from the address input unit 2.

The address transition detector 5 includes first and second address transition detectors 5a and 5b, respectively, for detecting the transition of the signals ADS0 and ADS1 outputted from the address input unit 2 and for outputting the address transition detection pulses ATP0 and ATP1, and an OR gate 5c provided for ORing the address transition detection pulses ATP0 and ATP1 outputted from the first and second address transition detectors 5a and 5b, respectively, and for outputting the address transition detection pulse ATP.

The logic operator 7 includes AND gates A5, A6, A7, and A8 each of which provides for ANDing the signal outputted from AND gates A1, A2, A3, and A4, respectively, of the address decoding unit 4 and the word line enable signal WLE outputted from the pulse generator 6.

The operation of the conventional static RAM circuit will now be explained with reference to FIG. 2.

To begin with, when an address is designated to readout data stored in the memory cell 8, as shown in FIGS. 2A through 2C, a chip selection signal CSB of a low level signal, an enable signal WEB of a writing high level signal, and an output enable signal OEB of a low level signal are applied to the read/write control unit 1, respectively, from the outside of the static RAM circuit.

Thereafter, the read/write control unit 1 recognizes the operational state of the static RAM as a read cycle in accordance with the signals CSB, WEB, and OEB applied thereto and applies a first control signal CS of a high level signal to the address input unit 2, and applies a second control signal WE of a low level signal to the data input unit 3.

The first control signal CS is an inverting signal of the chip selection signal CSB applied to the read/write control unit 1, and the second control signal WE is an inverting signal of the enable signal WEB applied to the read/write control unit 1.

Thereafter, the data input unit 3 is disabled by the second control unit WE of a low level signal outputted from the read/write control unit 1.

Meanwhile, as the first control signal CS of a high level signal is applied to the address input unit 2 from the read/write control unit 1, the address input unit 2 is enabled and receives first and second address signals AD0 and AD1 shown in FIGS. 2D and 2E, respectively, and outputs the signals ADS0 and ADS1 corresponding to the first and the second address signals AD0 and AD1.

The address decoding unit 4 decodes the signals ADS0 and ADS1 outputted from the address input unit 2. That is, the inverter I1 inverts the signal ADS0 and the inverter I2 inverts the signal ADS1.

The AND gate A1 ANDs the signals outputted from the inverters I1 and I2 and applies the ANDed signals to one terminal of the AND gate A5 of the logic operation unit 7. The AND gate A2 ANDs the signal outputted from the inverter I1 and the signal ADS1 and applies the ANDed signals to one terminal of the AND gate A6.

In addition, the AND gate A3 ANDs the signal outputted from the inverter I2 and the signal ADS0 and applies the ANDed signal to the AND gate A7. The AND gate A4 ANDs the signals ADS0 and ADS1 and applies the ANDed signal to one terminal of the AND gate A8 in the logic operation unit 7.

Meanwhile, in the address transition detection unit 5, the first and second address transition detection units 5a and 5b, as shown in FIGS. 2F and 2G, respectively, receive the signals ADS0 and ADS1 and detect the transitions of the signals ADS0 and ADS1, and apply the address transition detection pulses ATP0 and ATP1 of a low level signal to the AND gate 5c. Thereafter, the AND gate 5c, as shown in FIG. 2I, ANDs the address transition detection pulses ATP0 and ATP1 of a low level signal each outputted from the first and second address transition detection units 5a and 5b and applies the address transition detection signal ATP of a low level signal to the pulse generation unit 6.

The pulse generation unit 6, as shown in FIG. 2J, detects a descending point of the address transition detection pulse ATP of a low level signal outputted from the AND gate 5c and generates the word line enable signal WLE of a low level signal and outputs the word line enable signal WLE of a high level signal. In addition, the pulse generation unit 6, as shown in FIG. 2K, detects an ascending point of the address transition detection signal ATP outputted from the AND gate 5c and generates the sense amplifying enable signal SAE of a low level signal and applies the sense amplifying enable signal SAE of a high level signal to the data transmission unit 9 and the sense amplifier 10, respectively. Therefore, the sense amplifying enable signal SAE of a low level signal is generated after a predetermined time T after a word line enable signal WLE of a high level signal is generated.

Meanwhile, in the logic operation unit 7, the AND gates A5, A6, A7, and A8 receive the signals outputted from the AND gates A1, A2, A3, and A4, respectively, of the address decoding unit 4 and also receive and logically operate the word line enable signal WLE outputted from the pulse generation unit 6 and outputs the logically operated data. In addition, one word line out of the word lines is enabled by a result of the above described logic operation. In FIG. 1, there is shown one occasion that a word line WL is enabled by the signal outputted from the AND gate A5. That is, as shown in FIG. 2L, the word line WL becomes a high level signal when a word line enable signal WLE is a high level signal. At this time, the reason that there is shown a dotted line is because when a word line WL is enabled, an undesired word line is instantly enabled since the address signals AD0 and AD1 are inputted with a predetermined delay time. Therefore, the data stored in the memory cell 8 is applied to the data transmission unit 9 through the bit lines BL and BLB, as shown in FIG. 2M.

Thereafter, the data transmission unit 9 is enabled by the sense amplifying enable signal SAE of a low level signal and applies the data, outputted from the bit lines BL and BLB, to the sense amplifier 10. The sense amplifier 10 is enabled by the sense amplifying enable signal SAE of a low level signal outputted from the pulse generation unit 6 and amplifies the data outputted from the data transmission unit 9 by a predetermined level and applies the amplified data SAO and SAOB to the output buffer 11, as shown in FIG. 2N. The output buffer 11 stores the data SAO and SAOB outputted from the sense amplifier 10 and at the same time outputs the data SAO and SAOB—DATA OUT.

Meanwhile, in order to store desired data into the memory cell 8, when a certain address is designated, a chip selection signal CSB, a write enable signal WEB, and an output enable signal OEB outputted from the outside of the static RAM for a predetermined time T1+T2+T3 are applied to the read/write control unit 1. When a chip selection signal CSB of high and low level signals, a write enable signal WEB of a high level signal, an output enable signal OEB of a high level signal for a predetermined time T1 are applied to the read/write control unit 1, the write/read control unit 1 recognizes the signal applied thereto as a read cycle by the signals CSB, WEB, and OEB and outputs the first control signal CS of a high level signal and the second control signal WE of a low level signal. The operation of the static RAM for a predetermined time T1 is the same as the operation of the read cycle described above and, therefore, a description of that operation is omitted.

When a chip selection signal CSB of a low level signal, an enable signal WEB of a low level signal, and an output enable signal OEB of a high level signal for a predetermined time T2 is applied to the read/write control unit 1, respectively, the read/write control unit 1 recognizes the signals applied thereto as a write cycle in accordance with the signals CSB, WEB, and OEB and applies the first control signal CS of a high level signal to the address input unit 2 and applies the second control signal WE of a high level signal to the data input unit 3. As the first control signal CS of a high level signal is applied to the address input unit 2, the description of the operations of the address input unit 2, the address decoding unit 4, and the address transition detection unit 5 is omitted because the operations thereof are the same as the read cycle.

Meanwhile, the pulse generation unit 6, as shown in FIGS. 2J and 2K, applies the word line enable signal WLE of a high level signal t the logic operation unit 7 and applies the sense enable signal SAE of a high level signal to the data transmission unit 10. Also, the data input unit 3 is enabled by the second control signal WE of a high level signal outputted from the read/write control unit 1 and applies the data corresponding to the externally applied data DATA IN to the data transmission unit 9. The data transmission unit 9 is enabled by a sense amplifying enable signal SAE of a high level signal outputted from the pulse generation unit 6 and stores the data outputted from the data input unit 9 into the memory cell 8 through the bit lines BL and BLB. Meanwhile, in a write cycle for a predetermined time T3, a chip selection signal CSB of low and high level signals, a write enable signal WEB of a high level signal, and an output enable signal OEB of a high level signal are applied to the read/write control unit 1, respectively. The read/write control unit 1 recognizes the signals applied thereto as a read cycle.

In the conventional static RAM circuit, since an address enable signal is generated at a descending point on a line of the address transition detection signal in a read cycle and since a sense amplifying enable signal is generated at an ascending point of the address transition detection signal, there are disadvantages in that the word line enable point and the sense amplifying enable point are delayed by a predetermined time T, so that the access time to the data stored in the memory cell is delayed. In addition, the word line enable points of the read cycle and the write cycle are the same, and an address cycle changes in a relation between the write enable signal and the address signal, and a writing operation is performed in an undesired address when a word line is enabled by a new address signal when a write enable signal changes to a read cycle.

SUMMARY OF THE INVENTION

The present invention has been made in view of the above circumstances and has as an object to provide a pulse generation circuit of a memory, which overcomes the problems encountered in a conventional pulse generation circuit.

A further object of the present invention is to provide an improved pulse generation circuit of a memory capable of advantageously reducing an access time to the data stored in a memory cell in a read cycle by concurrently generating a word line enable signal and a sense amplifying enable signal in a read cycle and by permitting the enabling time between a word line enable signal and a sense amplifying enable signal be the same.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, the present invention provides a pulse generation circuit of a memory comprising a first logic operation unit for performing a logical operation on an address transition detection pulse and a delayed address transition detection pulse to produce first and second pulses, a switching unit controlled by an externally applied write enable signal for selecting one of the first and second pulses as an output pulse and for inverting the write enable signal, and a second logic operation unit for performing a logical operation on the output pulse and the inverted write enable signal from the switching unit to generate a word line enable signal and a sense amplifying enable signal.

To further achieve the objects and in accordance with the purpose of the invention, as embodied and broadly described herein, the present invention provides a memory circuit comprising means for generating an address transition detection pulse, means for generating a delayed address transition detection pulse, means for generating a write enable signal, a first logic operation unit for performing a logical operation on the address transition detection pulse and the delayed address transition detection pulse to produce first and second pulses, a switching unit controlled by the write enable signal for selecting one of the first and second pulses as an output pulse and for inverting the write enable signal, and a second logic operation unit for performing a logical operation on the output pulse and the inverted write enable signal from the switching unit to generate a word line enable signal and a sense amplifying enable signal.

BRIEF DESCRIPTION OF THE DRAWINGS

The accompanying drawings, which are incorporated in and constitute a part of this specification illustrate embodiment of the invention and, together with the description, serve to explain the objects, advantages and principles of the invention. In the drawings:

FIG. 3 is a block diagram of a pulse generation circuit of a memory according to the present invention; and FIGS. 4A through 4H are diagrams of an operation timing of each element of FIG. 3 according to the present invention.

DETAILED DESCRIPTION OF THE PREFERRED EMBODIMENT

Figure 1:
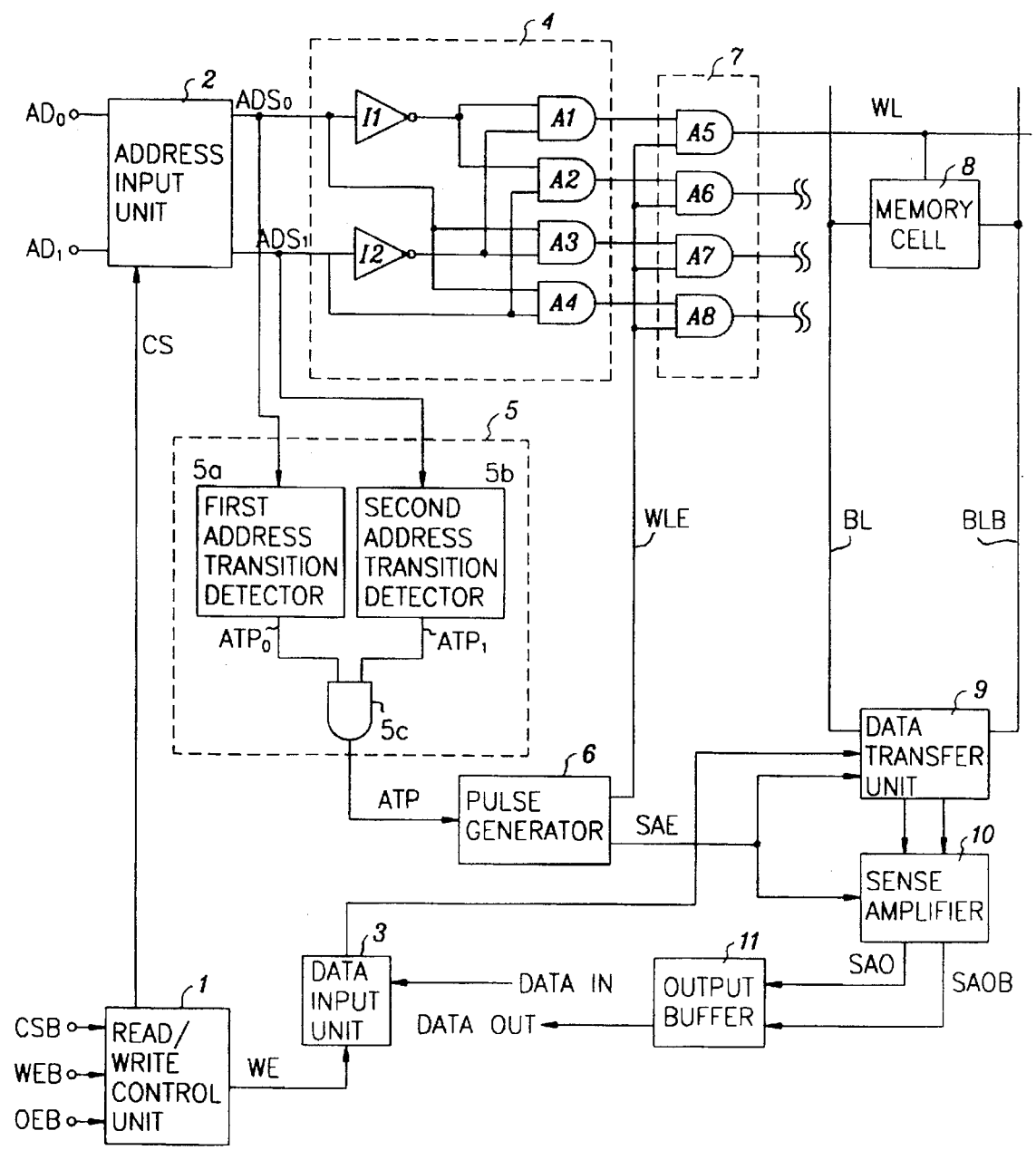
FIG. 1 is a block diagram of a conventional static RAM circuit.

As shown in FIG. 3, a pulse generation circuit of a memory according to the present invention includes a pulse extend unit 106 for delaying for a predetermined time an address transition detection pulse ATP outputted from an address transition detection unit 5 (FIG. 1), a first logic operation unit 206 for performing a logical operation on the address transition detection signal ATP and a signal outputted from the pulse delay unit 106 and for outputting a first and second pulses, a switching unit 306 switched by an externally applied write enable signal WEB for outputting a pulse among first and second pulses and a second logic operation unit 406 for performing a logical operation on a signal outputted from the switching unit 306 and an inverting signal of a write enable signal WEB outputted from a logic operation unit 7 (FIG. 1) and for outputting a sense amplifying enable signal SAE to a data transmission unit 9 and a sense amplifier 10 (FIG. 1).

The first logic operation unit 206 includes a NAND gate 236 for NANDing the address transition detection pulse ATP outputted from the address transition detection unit 5 and a signal outputted from the pulse delay unit 106 through the inverters 216 and 226. A NAND gate 246 NANDs the address transition detection pulse ATP outputted from the address transition detection unit 5 and a pulse outputted from the pulse delay unit 106 through the inverter 216, then outputs the NANDed signals to the inverter 256.

The switching unit 306 includes first and second transmission gates 336 and 346 which are inversely switched by a signal sequentially outputted from the inverters 316 and 326 and a signal outputted from the inverter 316.

The second logic operation unit 406 includes inverters 416 and 446 for inverting a signal outputted from the first transmission gate 336 and the second transmission gate 346 and for outputting a word line enable signal WLE in the switching unit 306, and a NOR gate 426 for NORing the signal outputted from the inverter 416 and the signal outputted from the inverter 316 in the switching unit 306 and for outputting the NORed signals to the inverter 436.

The operation of the pulse generation circuit of a memory according to the present invention will now be explained.

Figure 2:
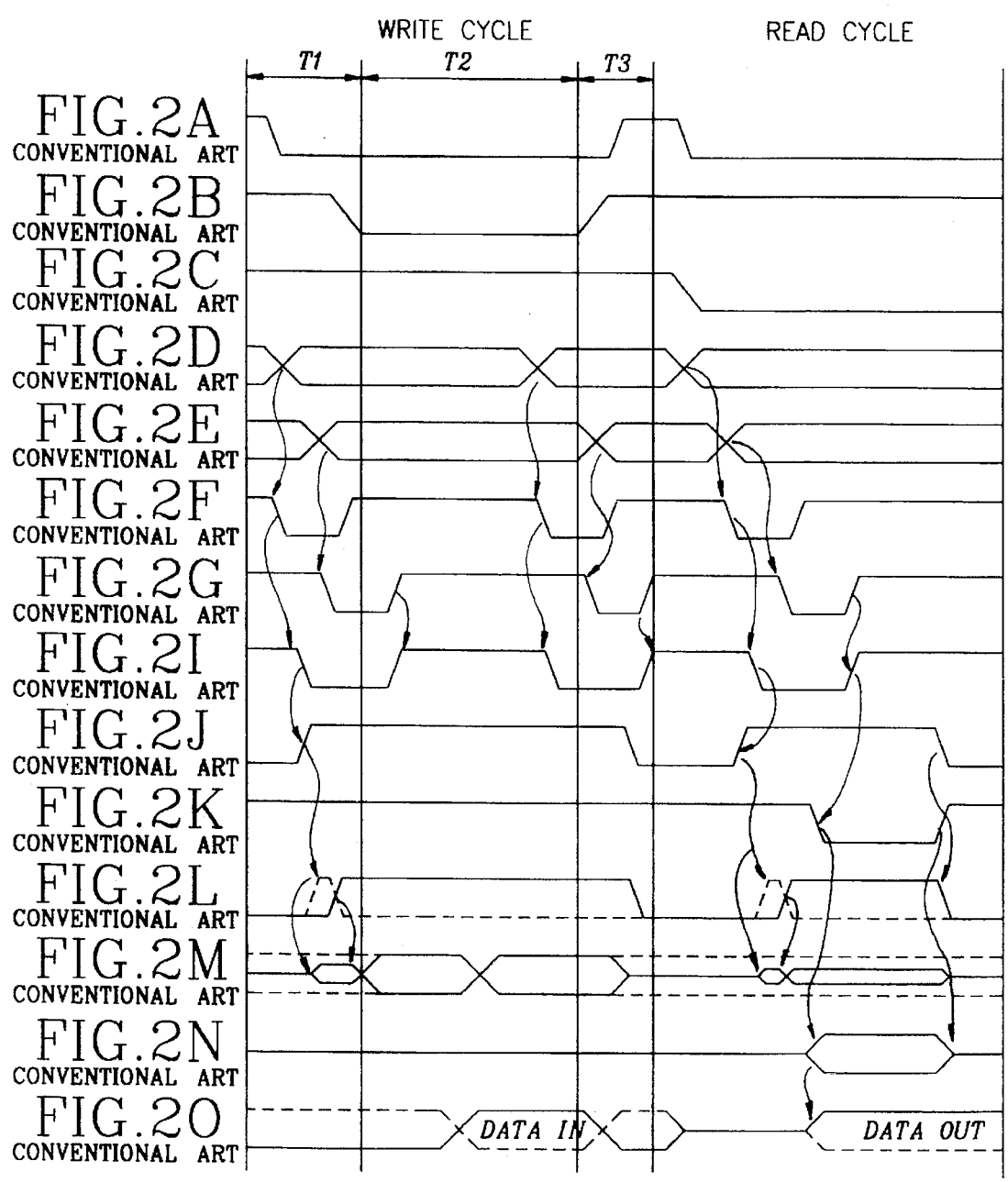
FIGS. 2A through 2O are timing diagrams for respective elements of FIG. 1.

To begin with, in a state that data is stored in the memory cell 8, when a user selects an address so as to readout a data stored in the memory cell 8, a chip selection signal CSB of a low level signal, a write enable signal WEB of a high level signal, and an output enable signal OEB of a low level signal, which are shown in FIGS. 2A through 2C, are applied to the read/write control unit 1, respectively. Here, the signal shown in FIG. 2B and the signal shown in FIG. 4A are the same.

Thereafter, the read/write control unit 1 recognizes an operational state of a static RAM circuit as a read cycle in accordance with a write enable signal WEB of a high level signal and an output enable signal OEB of a low level signal, and applies the first control signal CS of a high level signal to the address input unit 2, and applies the second control signal of a low level signal to the data input unit 3.

A description of the operation of the address input unit 2, the address decoding unit 4, and the address transition detection unit 5 is emitted because it is the same as the operation of a read cycle.

Meanwhile, the pulse delay unit 106 of the pulse generation unit 6 outputs the address transition detection pulse ATP of a low level signal, as shown in FIG. 4B, outputted from the address transition detection unit with a predetermined delay time.

Thereafter, the NAND gate 236 of the first logic operation unit 206 receives an address transition detection pulse ATP outputted from the address transition detection unit 5, and NANDs the pulses sequentially outputted from the inverters 216 and 226, and outputs the pulses shown in FIG. 4D at a point of a node N1.

In addition, the NAND gate 246 of the first logic operation unit 206 receives an address transition detection pulse ATP of a low level signal outputted from the address transition detection unit 5, and NANDs the pulse outputted from the inverter 216 in the first logic operation unit 206, that is, the pulses generated at a node NO shown in FIG. 4C, and outputs the pulses which is outputted at a node N2 shown in FIG. 4E. Meanwhile, an externally applied write enable signal WEB of a high level signal, that is, shown in FIG. 4A, is inverted to a low level signal by the inverter 316 of the switching unit 306, and is applied to the PMOS terminal of the first transmission gate 336 and the NMOS terminal of the second transmission gate 346.

In addition, the low signal outputted from the inverter 316 in inverted to a high level signal by the inverter 326 and is applied to the NMOS terminal of the first transmission gate 336 and the PMOS terminal of the second transmission gate 346. Therefore, the first and second transmission gates 336 and 346 are turned on and turned off, respectively, by a low level signal outputted from the inverter 316 and by a high level signal outputted from the inverter 326.

The pulse outputted from the NAND gate 236 in the first logic operation unit 206 is detected at a node N3 as shown in FIG. 4F and is applied to the inverter 416 of the second logic operation unit 406. Meanwhile, the pulse outputted from the inverter 256 of the first logic operation unit 206 is cut off by the second transmission gate 346.

The inverters 416 and 446 of the second logic operation unit 406 apply the word line enable signal WLE of a high level signal as shown in FIG. 4G to the logic operation unit 7, and the output signal of the inverter 416 is applied to the NOR gate 426. Therefore, the NOR gate 426 receives the signal of a low level signal outputted from the inverter 416, and NORs the signal of a low level signal outputted from the inverter 316, and applies the sense amplifying enable signal SAE of a low level signal as shown in FIG. 4H to the data transmission unit 9 and the sense amplifying unit 10. That is, since the timing of becoming a low level signal between the word line enable signal WLE and the sense amplifying enable signal SAE is the same, the enabling timing between the world line WL and the sense amplifier 10 is the same.

Meanwhile, when an address is designated so as to store the desired data, a chip selection signal CSB, a write enable signal WEB, and an output enable signal OEB which are applied from the outside of a static RAM for a predetermined time Ti+T2+T3 in a write cycle shown in FIG. 4. When the chip selection signal CSB of high and low level signals, the write enable signal WEB of a high level signal, and the output enable signal OEB of a high level signal are applied to the read/write control unit 1 for a predetermined time T1, the read/write control unit 1 recognizes the signals applied thereto as a read cycle by the signals CSB, WEB, and OEB, and outputs the first control signal CS of a high level signal and the second control signal WE of a low level signal.

A description of the operation of a static RAM for a predetermined time T1 is omitted because it is the same as that for the read cycle.

A chip selection signal CSB of a low level signal, a write enable signal WEB of a low level signal WEB, and an output enable signal OEB for a predetermined time T2 are applied to the read/write control unit 1. The read/write control unit 1 recognizes the signals applied thereto as a write cycle by the signals CSB, WEB, and OEB, and applies the first control signal CS of a high level signal to the address input unit 2, and applies the second control signal WE of a high level signal to the data input unit 3. The first control signal of a high level signal is applied to the address input unit 2.

A description of the operation of the address input unit 2, the address decoding unit 4, and the address transition detection unit 5 is omitted because it is the same as that for the read cycle.

Meanwhile, the first logic operation unit 206 of the pulse generation unit 6 outputs the signals having waveforms shown in FIGS. 4D and 4E. Also, the externally applied write enable signal WEB of a low level signal shown in FIG. 4A is inverted to a high level signal by the inverter 316 in the switching unit 306 and is applied to the PMOS terminal of the first transmission gate 336 and to the NMOS terminal of the second transmission gate 346.

In addition, the high level signal outputted from the inverter 316 is inverted to a low level signal by the inverter 326 and is applied to the PMOS terminal of the second transmission gate 346. Therefore, the first and second transmission gates 336 and 346 are turned off and on, respectively, by the high level signal outputted from the inverter 316 and by the low level signal outputted from the inverter 326.

The pulse outputted from the NAND gate 236, that is, at the node N1, in the first logic operation unit 206 as shown in FIG. 4D is cut off by the first transmission gate 336. In addition, the pulse outputted from the inverter 256 of the first logic operation unit 206, that is, at the node N2 as shown in FIG. 4E, is applied to the input terminal of the inverter 416 of the second logic operation unit 406, that is, as detected at the node N3 as shown in FIG. 4F.

The second logic operation unit 406 applies the word line enable signal WLE of a high level signal as shown in FIG. 4G to the logic operation unit 7, and applies the sense amplifying signal SAE of a high level signal as shown in FIG. 4H to the data transmission unit 9 and the sense amplifying unit 10. Meanwhile, the data input unit 3 is enabled by the second control signal WE of a high level signal outputted from the read/write control unit 1, and applies the data corresponding to the externally inputted data to the data transmission unit 9.

In addition, the data transmission unit 9 is enabled by the sense amplifying enable signal SAE of a high level signal outputted from the pulse generation unit 6 and stores the data outputted from the data input unit 3 to the memory cell 8 through the bit lines BL and BLB. Meanwhile, since the write enable signal WEB of a high level signal is applied to the read/write control unit 1 for a predetermined time T3, the read/write control unit recognizes the signals applied thereto as a read cycle.

As described above, the pulse generation circuit of a memory according to the present invention reduces an access time to the data stored in a memory cell in a read cycle by concurrently generating the enabling time between a word line enable signal and a sense amplifying enable signal and by permitting the enabling time between a word line enable signal and a sense amplifying enable signal be the same. In addition, in a write cycle when an address signal is changed, a word line is disabled for an address transition detection pulse generation, and a write operation is not performed, so that a write recovery time margin, which is related to an address signal and a write enable signal, can be obtained.

The foregoing description of preferred embodiment of the invention has been presented for purposes of illustration and description. It is not intended to be exhaustive or to limit invention to the precise form disclosed, and modifications and variations are possible in light of the above teachings or may be acquired from practice of the invention. The embodiment was chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A pulse generation circuit of a memory, comprising:

a first logic operation unit for performing a logical operation on an address transition detection pulse and a delayed address transition detection pulse to produce first and second pulses;

a switching unit controlled by an externally applied write enable signal for selecting one of the first and second pulses as an output pulse and for inverting the write enable signal; and a second logic operation unit for performing a logical operation on the output pulse and the inverted write enable signal from the switching unit to generate a word line enable signal and a sense amplifying enable signal.

2. The circuit of claim 1, wherein the first logic operation unit includes:

a first inverter for inverting the delayed address transition detection pulse;

a second inverter for inverting an output signal from the first inverter;

a first NAND gate for NANDing an output signal from the second inverter and the address transition detection pulse; and a second NAND gate for NANDing the address transition detection pulse and the output signal from the first inverter.

3. The circuit of claim 1, wherein the switching unit includes:

a first inverter;

a second inverter for inverting an output signal from the first inverter; and first and second transmission gates which are inversely switched by the output signal from the first inverter and an output signal from the second inverter.

4. The circuit of claim 1, wherein the switching unit includes:

a first inverter for inverting the write enable signal;

a second inverter for inverting an output signal from the first inverter; and first and second transmission gates which are inversely switched by the output signal from the first inverter and an output signal from the second inverter.

5. The circuit of claim 1, wherein the second logic operation unit includes:

a first inverter for inverting the output pulse from the switching unit to produce a first inverted signal;

a second inverter for inverting the first inverted signal to produce the word line enable signal;

a NOR gate for NORing the first inverted signal and the inverted write enable signal; and a third inverter for inverting an output signal from the NOR gate to produce the sense amplifying enable signal.

6. A memory circuit comprising:

means for generating an address transition detection pulse;

means for generating a delayed address transition detection pulse;

means for generating a write enable signal;

a first logic operation unit for performing a logical operation on the address transition detection pulse and the delayed address transition detection pulse to produce first and second pulses;

a switching unit controlled by the write enable signal for selecting one of the first and second pulses as an output pulse and for inverting the write enable signal; and a second logic operation unit for performing a logical operation on the output pulse and the inverted write enable signal from the switching unit to generate a word line enable signal and a sense amplifying enable signal.

7. The circuit of claim 6, wherein the first logic operation unit includes:

a first inverter for inverting the delayed address transition detection pulse;

a second inverter for inverting an output signal from the first inverter;

a first NAND gate for NANDing an output signal from the second inverter and the address transition detection pulse; and a second NAND gate for NANDing the address transition detection pulse and the output signal from the first inverter.

8. The circuit of claim 6, wherein the switching unit includes:

a first inverter;

a second inverter for inverting an output signal from the first inverter; and first and second transmission gates which are inversely switched by the output signal from the first inverter and an output signal from the second inverter.

9. The circuit of claim 6, wherein the switching unit includes:

a first inverter for inverting the write enable signal;

a second inverter for inverting an output signal from the first inverter; and first and second transmission gates which are inversely switched by the output signal from the first inverter and an output signal from the second inverter.

10. The circuit of claim 6, wherein the second logic operation unit includes:

a first inverter for inverting the output pulse from the switching unit to produce a first inverted signal;

a second inverter for inverting the first inverted signal to produce the word line enable signal;

a NOR gate for NORing the first inverted signal and the inverted write enable signal; and a third inverter for inverting an output signal from the NOR gate to produce the sense amplifying enable signal.

* * * * *